United States Patent
Banda et al.

(10) Patent No.: US 12,033,881 B2
(45) Date of Patent: Jul. 9, 2024

(54) REDUCED LOCALIZED FORCE IN ELECTROSTATIC CHUCKING

(71) Applicant: Applied Materials, Inc., Santa Clara, CA (US)

(72) Inventors: Sumanth Banda, San Jose, CA (US); Vladimir Knyazik, Sunnyvale, CA (US); Stephen D. Prouty, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 17/205,867

(22) Filed: Mar. 18, 2021

(65) Prior Publication Data

US 2022/0301913 A1    Sep. 22, 2022

(51) Int. Cl.
| H01L 21/683 | (2006.01) |
| H01L 21/673 | (2006.01) |
| H02N 13/00  | (2006.01) |

(52) U.S. Cl.
CPC ........ *H01L 21/6833* (2013.01); *H01L 21/673* (2013.01); *H02N 13/00* (2013.01)

(58) Field of Classification Search
CPC .... H01L 21/673; H01L 21/6833; H02N 13/00
USPC ...................................................... 414/751.1
See application file for complete search history.

(56) References Cited

U.S. PATENT DOCUMENTS

| 2004/0040665 A1* | 3/2004 | Mizuno | H02N 13/00 118/728 |
| 2006/0158823 A1* | 7/2006 | Mizuno | H01L 21/6875 361/234 |
| 2009/0059462 A1* | 3/2009 | Mizuno | H02N 13/00 361/234 |
| 2009/0122459 A1* | 5/2009 | Mizuno | H02N 13/00 361/234 |
| 2010/0046134 A1* | 2/2010 | Mizuno | H02N 13/00 361/234 |
| 2010/0096262 A1* | 4/2010 | Aruga  | H01L 21/6833 204/298.08 |

FOREIGN PATENT DOCUMENTS

| JP | 2004282047 A | 10/2004 |
| JP | 2008135736 A | 6/2008 |
| JP | 2010205813 A | 9/2010 |
| JP | 2014041903 A | 3/2014 |
| TW | 201803005 A | 1/2018 |

OTHER PUBLICATIONS

Application No. PCT/US2022/019702, International Search Report and Written Opinion, Mailed On Jun. 28, 2022, 10 pages.

\* cited by examiner

*Primary Examiner* — Saul Rodriguez
*Assistant Examiner* — Brendan P Tighe
(74) *Attorney, Agent, or Firm* — Kilpatrick Townsend & Stockton LLP

(57) ABSTRACT

Semiconductor substrate support assemblies may include an electrostatic chuck body having a substrate support surface. The electrostatic chuck body may define a plurality of protrusions extending from the substrate support surface. The assemblies may include an electrode embedded within the electrostatic chuck body. The electrode may define apertures through the electrode in line with the plurality of protrusions extending from the substrate support surface.

18 Claims, 4 Drawing Sheets

REDUCED LOCALIZED FORCE IN ELECTROSTATIC CHUCKING

TECHNICAL FIELD

The present technology relates to semiconductor systems, processes, and equipment. More specifically, the present technology relates to processes and systems to protect substrates on support assemblies.

BACKGROUND

Many substrate processing systems use substrate supports, such as an electrostatic chuck in combination with a base, to retain a wafer during semiconductor substrate processing. An embedded electrode may electrostatically chuck a wafer or substrate to the substrate support. A voltage may be applied to the electrode, which provides the clamping force. However, this clamping force may cause backside damage to the substrate, and may produce backside particles that may cause issues in subsequent processing.

Thus, there is a need for improved systems and methods that can be used to improve lifetime and performance of processing chambers and components. These and other needs are addressed by the present technology.

SUMMARY

Semiconductor substrate support assemblies may include an electrostatic chuck body having a substrate support surface. The electrostatic chuck body may define a plurality of protrusions extending from the substrate support surface. The assemblies may include an electrode embedded within the electrostatic chuck body. The electrode may define apertures through the electrode in line with the plurality of protrusions extending from the substrate support surface.

In some embodiments, the electrode may include a continuous electrode through the electrostatic chuck body and about the plurality of protrusions. The electrode may define an aperture in line with each protrusion of the plurality of protrusions. Each aperture may be characterized by a greater diameter than a diameter of a corresponding protrusion with which the aperture is in line. Each aperture may extend a diameter greater than or about 5% more than a diameter of a corresponding protrusion along the substrate support surface. The assemblies may include a sealing band defined about an exterior of the electrostatic chuck body. The assemblies may include a gas delivery channel formed through the electrostatic chuck body. The gas delivery channel may be configured to deliver a backside gas to volume defined between the plurality of protrusions and the sealing band. The gas delivery channel may be fluidly coupled with a fluid source. The fluid source may be or include helium gas. The assemblies may include a power supply coupled with the electrode embedded within the electrostatic chuck body. The power supply may be configured to provide a chucking voltage to the electrode.

Some embodiments of the present technology may encompass substrate support assemblies. The assemblies may include an electrostatic chuck body. The electrostatic chuck body may define a plurality of protrusions along a substrate support surface of the electrostatic chuck body. The assemblies may include an electrode embedded within the electrostatic chuck body. The electrode may define a plurality of apertures through the electrode. Each aperture of the plurality of apertures may be formed vertically in line with a protrusion of the plurality of protrusions along the substrate support surface.

In some embodiments, the electrode may include a continuous electrode through the electrostatic chuck body and about the plurality of protrusions. Each protrusion may be characterized by a diameter of greater than or about 1 mm. Each aperture may be characterized by a greater diameter than a diameter of a corresponding protrusion with which the aperture is in line. Each aperture may extend a diameter greater than or about 3% more than a diameter of a corresponding protrusion along the substrate support surface. The assemblies may include a sealing band defined about an exterior of the electrostatic chuck body. The assemblies may include a gas delivery channel formed through the electrostatic chuck body. The gas delivery channel may be configured to deliver a backside gas to volume defined between the plurality of protrusions and the sealing band. The gas delivery channel may be fluidly coupled with a fluid source. The fluid source may be or include helium gas. The assemblies may include a power supply coupled with the electrode embedded within the electrostatic chuck body. The power supply may be configured to provide a chucking voltage to the electrode.

Some embodiments of the present technology may encompass methods of semiconductor processing. The methods may include providing a voltage to an electrode embedded in an electrostatic chuck body. The electrostatic chuck body may define a plurality of protrusions along a substrate support surface of the electrostatic chuck body. The electrode may define a plurality of apertures through the electrode. Each aperture of the plurality of apertures may be formed vertically in line with a protrusion of the plurality of protrusions along the substrate support surface. The methods may include clamping a substrate to the electrostatic chuck body. In some embodiments, the voltage may be greater than or about 1000 V. A chucking force at each protrusion of the plurality of protrusions may be less than or about 98% of the chucking force between each protrusion of the plurality of protrusions.

Such technology may provide numerous benefits over conventional systems and techniques. For example, the processes may reduce localized chucking force at locations across the substrate support, while still affording sufficient global chucking force. Additionally, the processes may reduce or limit backside particles, which may facilitate downstream processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
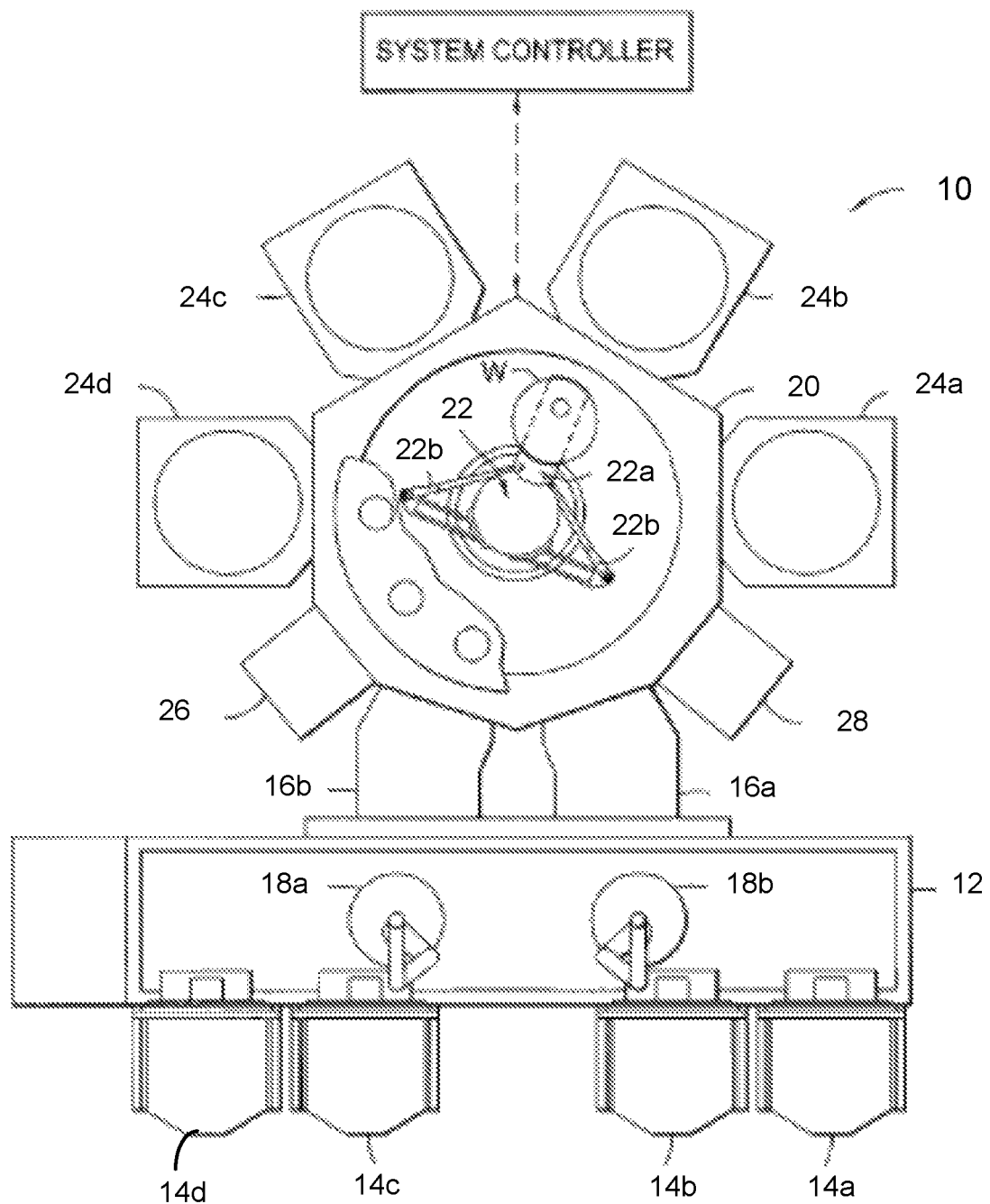
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma etching processes may energize one or more constituent precursors to facilitate material removal from a substrate. The conditions of the process may cause a substrate to be dislodged or shifted if not properly clamped. Additionally, the formed films on a substrate may cause stresses on the substrate. For example, as processing may include more films to produce complex structures, thicker layers of material may be developed on a substrate. These produced films may be characterized by internal stresses that act upon the substrate. This may cause a substrate to bow during processing, which if not controlled can lead to poor uniformity of removal, as well as device damage or malfunction.

An electrostatic chuck may be used to produce a clamping action against the substrate to overcome the bowing stress and maintain the substrate during etch processes. However, as these device structures increase in thickness and complexity, the stresses acted upon the substrate increase, which may require a proportional increase in chucking voltage. Additionally, many etch processes may be performed at relatively high temperatures that further affect components of the chamber. For example, some etch activities may occur at temperatures of several hundred degrees or higher, which may cause the substrate to thermally expand outward radially. The expansion in combination with the increased chucking voltage may cause scratches to be formed on the backside of a semiconductor substrate in contact with the substrate support, as well as cause particles to be dislodged from the underlying chuck body.

These scratches and particles may cause multiple challenges. For example, when a substrate is removed from processing and replaced in a front-opening unified pod with other processed substrates, particles generated from the contact may fall to underlying substrates, which may act as defects in the produced films for the underlying substrates. Additionally, some subsequent processing may be affected by the damage. For example, subsequent operations may include lithography. Backside damage may cause displacement of the projected beam through the substrate, which may affect the lithography process, or the particles may impact the sensitive lithography base. These issues have limited conventional technologies and caused loss of wafers due to the impact on subsequent processing, as well as damage to lithographic components. The present technology overcomes these challenges by incorporating an electrode within a substrate support, which may reduce electrostatic force at the locations of contact with a substrate. This may limit substrate backside damage, especially at increased temperatures.

Although the remaining disclosure will routinely identify specific etching and cleaning processes utilizing the disclosed technology, it will be readily understood that the systems and methods are equally applicable to a variety of other processes as may occur in the described chambers. Accordingly, the technology should not be considered to be so limited as for use with the described etching or cleaning processes alone. The disclosure will discuss one possible system and chamber that can be used with the present technology before describing systems and methods or operations of exemplary process sequences according to some embodiments of the present technology. It is to be understood that the technology is not limited to the equipment described, and processes discussed may be performed in any number of processing chambers and systems.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
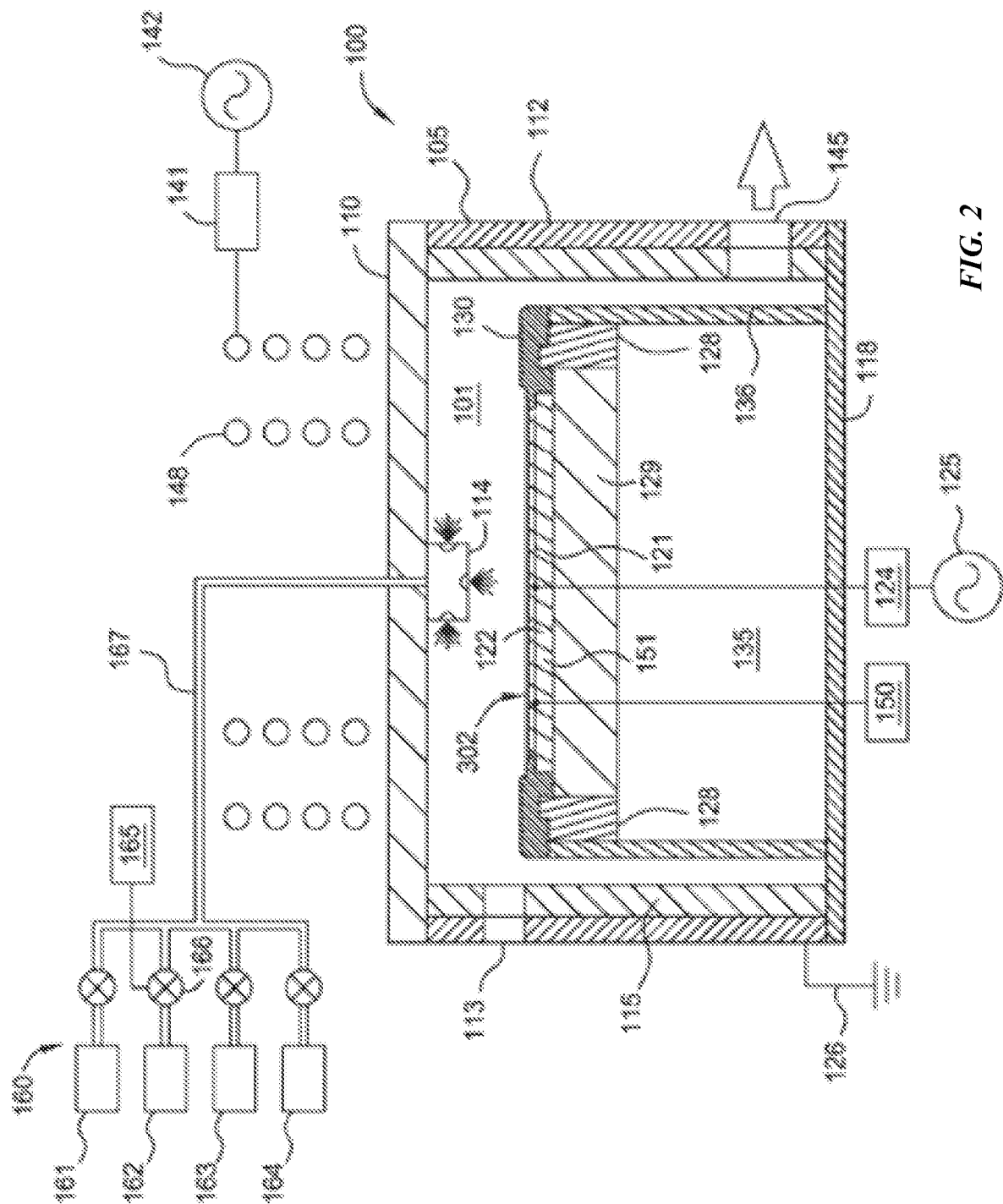
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3A:
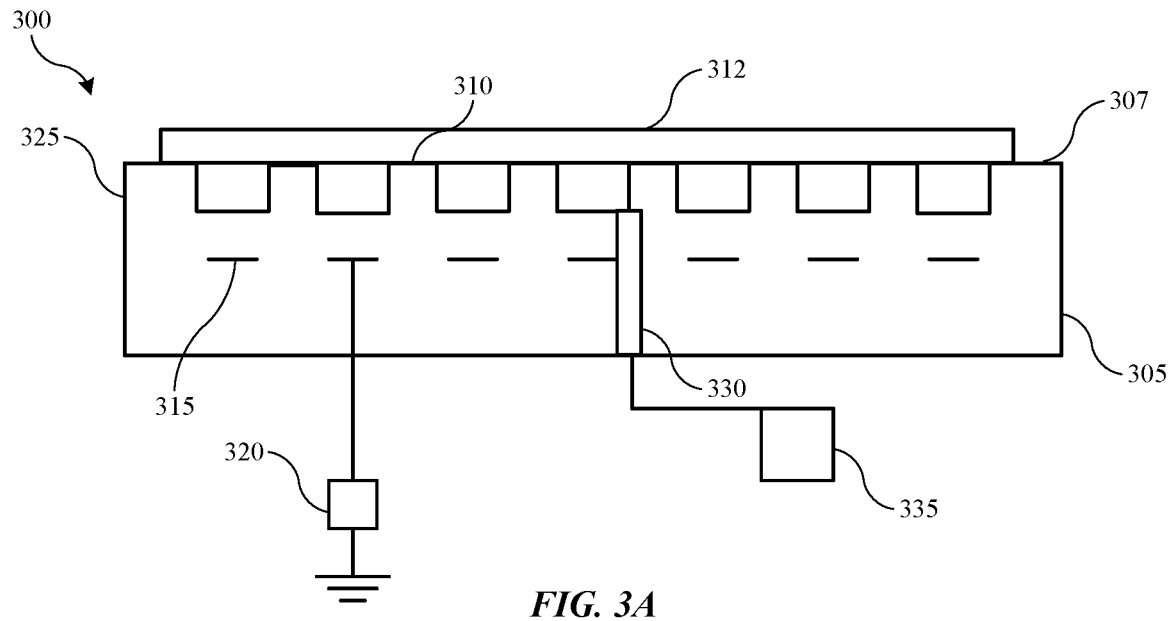
FIG. 3A shows a schematic partial cross-sectional view of an exemplary substrate support according to some embodiments of the present technology.

FIG. 3A shows a schematic partial cross-sectional view of an exemplary substrate support 300 according to some embodiments of the present technology. For example, substrate support 300 may illustrate a portion of support pedestal 135 described above, and may include any aspect of that support assembly, including electrodes, heaters, or any other components as may be incorporated in substrate supports. Substrate support 300 may also illustrate additional details of support assemblies described above. Substrate support 300 may illustrate a generalized cross-section of a support structure according to embodiments of the present technology, which may be extended to any length or diameter across a substrate encompassed by the present technology. It is to be understood that substrate support 300 is not illustrated to any particular scale, and is included merely to illustrate aspects of the present technology.

Substrate support 300 may include a number of components bonded, welded, joined, or otherwise coupled with one another. Although a number of additional components may be included, as illustrated, the substrate support 300 may include an electrostatic chuck body 305 or top puck, which may be coupled with a power source to provide electrostatic chucking or clamping of a substrate on a surface of the puck. The components incorporated within the top puck may not be exposed to processing materials in some embodiments, and may be fully retained within the chuck body. Electrostatic chuck body 305 may define a substrate support surface 307, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body. Although any surface topography may be encompassed by the present technology, in some embodiments electrostatic chuck body 305 may define a number of mesas or protrusions 310 on which a substrate 312 may be seated. Between the protruding portions of the puck may be recessed regions as illustrated.

The electrostatic chuck body 305 may include an electrode 315, which may be a DC electrode, embedded within the chuck body proximate the substrate support surface. Electrode 315 may be electrically coupled with a power supply 320. Power supply 320 may be configured to provide energy or voltage to the electrically conductive chuck electrode 315. This may be operated to form a plasma of a precursor within the processing region of the semiconductor processing chamber within which the substrate support assembly is disposed, although other plasma operations may similarly be sustained. For example, electrode 315 may also be a chucking electrode that operates as electrical ground for a capacitive plasma system including an RF source electrically coupled with a showerhead or other chamber component. For example, electrode 315 may operate as a ground path for RF power from the RF source coupled elsewhere in the chamber, while also operating as an electrical bias to the substrate to provide electrostatic clamping of the substrate to the substrate support surface. Power supply 320 may include a filter, a power supply, and a number of other electrical components configured to provide a chucking voltage.

In operation, a substrate 312 may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supply 320 may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

In some embodiments the electrostatic chuck body 305 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

During semiconductor processing, one or more backside gases may be flowed into the substrate support 300, such as through one or more gas delivery channels 330 extending through the stem of the substrate support. For example, a gas delivery system 335, which may include any number of valves, controllers, and/or piping, may provide one or more gases, which may be flowed in and around gaps within the substrate support. By providing a positive pressure of fluid, such as an inert or non-reactive gas, within the substrate support, improved heat transfer within the substrate support may be maintained. Any number of materials may be used as a heat transfer backside gas, and in some embodiments helium, nitrogen, argon, other noble gases, or other process gases may be utilized. Helium may be characterized by improved heat transfer relative to other precursors due to the relatively low molecular weight of the fluid. For example, thermal conductivity may increase as molecular weight decreases, and thus helium may facilitate improved temperature uniformity through the structure when flowed within gaps of the apparatus. In some embodiments, the helium may be augmented with one or more other precursors, which may adjust the thermal conductance of the backside gas. By providing nitrogen, argon, or other materials, the heat transfer characteristics of the fluid may be modulated for particular processes.

During substrate processing, a flow rate and/or pressure of the backside gas delivered may be maintained relatively low, and may be delivered at a flow rate to maintain an amount of pressure to improve thermal conductivity and maintain a minimal amount of leak through the substrate support into the processing region. Consequently, in some embodiments the flow rate may be maintained below or about 20 sccm, and may be maintained at below or about 15 sccm, below or about 12 sccm, below or about 10 sccm, below or about 9 sccm, below or about 8 sccm, below or about 7 sccm, below or about 6 sccm, below or about 5 sccm, below or about 4 sccm, below or about 3 sccm, below or about 2 sccm, below or about 1 sccm, or less, although an amount of flow may be maintained such that a controller of gas delivery system 335 may be operated above a threshold.

As explained previously, substrate 312 may be positioned on substrate support surface 307, and may contact each of the protrusions 310, and may additionally extend at least partially across a sealing band 325, which may extend about an exterior region of the chuck body, and which may allow a degree of sealing of a volume defined between and about the protrusions 310 and the substrate. Sealing band 325 may extend vertically from the surface of the chuck body, and may extend in a generally circumferential or peripheral pattern about the chuck body. In some embodiments, protrusions 310 may be characterized by a diameter or width of about 1 mm, about 2 mm, about 3 mm, or more, and may in some embodiments include a combination of protrusions characterized by a diameter of greater than or about 1 mm and protrusions characterized by a diameter of greater than or about 2 mm. The protrusions may be characterized by any number of geometries and profiles in embodiments of the present technology. For an exemplary substrate support assembly, the substrate support surface within the sealing band, or within an interior region, may define greater than or about 250 protrusions, and may define greater than or about 500 protrusions, greater than or about 750 protrusions, greater than or about 1,000 protrusions, greater than or about 1,250 protrusions, greater than or about 1,500 protrusions, greater than or about 1,750 protrusions, greater than or about 2,000 protrusions, or more. The protrusions may be defined in any number of formations or patterns including uniform patterns as well as general distributions across the surface.

By producing protrusions according to some embodiments of the present technology, a percentage of contact along a surface of a substrate may be increased to greater than or about 1.0%, and may be greater than or about 1.5%, greater than or about 2.0%, greater than or about 2.5%, greater than or about 3.0%, greater than or about 3.5%, greater than or about 4.0%, greater than or about 4.5%, greater than or about 5.0%, or greater. The percentage of contact may be maintained below or about 10% to limit leakage current below the previously stated ranges, and may limit contact below or about 8%, below or about 6%, below or about 5%, or less. Additionally, the protrusions themselves may be adjusted to affect the impact caused on substrates.

Power supply 320 may provide a voltage for clamping the substrate 312, and may be configured to provide a voltage of greater than or about 200 V, greater than or about 400 V, greater than or about 600 V, greater than or about 800 V, greater than or about 1000 V, greater than or about 1200 V, greater than or about 1400 V, greater than or about 1600 V, greater than or about 1800 V, greater than or about 2000 V, or higher. As explained previously, these high voltages may increase abrasion between the substrate and protrusions on which the substrate is seated. However, by reducing the voltage, a clamping force may be insufficient to overcome substrate bowing, and may also allow an amount of backside gas leakage from the sealing band. Although in some embodiments protrusions 310 may be characterized by rounded corners to limit backside damage of the substrate, increased particles may still be developed. Accordingly, the present technology may utilize an electrode configured to reduce local chucking voltage at the contact points between the chuck body and the substrate.

Electrode 315 may be characterized by a continuous conductive body extending through the chuck body. However, in some embodiments, electrode 315 may define one or more apertures, including a plurality of apertures through the electrode, which may be produced in line with the plurality of protrusions 310 extending from the substrate support surface. Accordingly, the electrode 315 may still extend continuously through the electrostatic chuck body, but may extend about some or all of the plurality of protrusions, including embodiments in which an aperture is defined through the electrode vertically in line with each protrusion of the plurality of protrusions as illustrated. Additionally, in some embodiments, and unlike a mesh electrode, apertures through the electrode may be limited to locations in line with a protrusion.

Figure 3B:
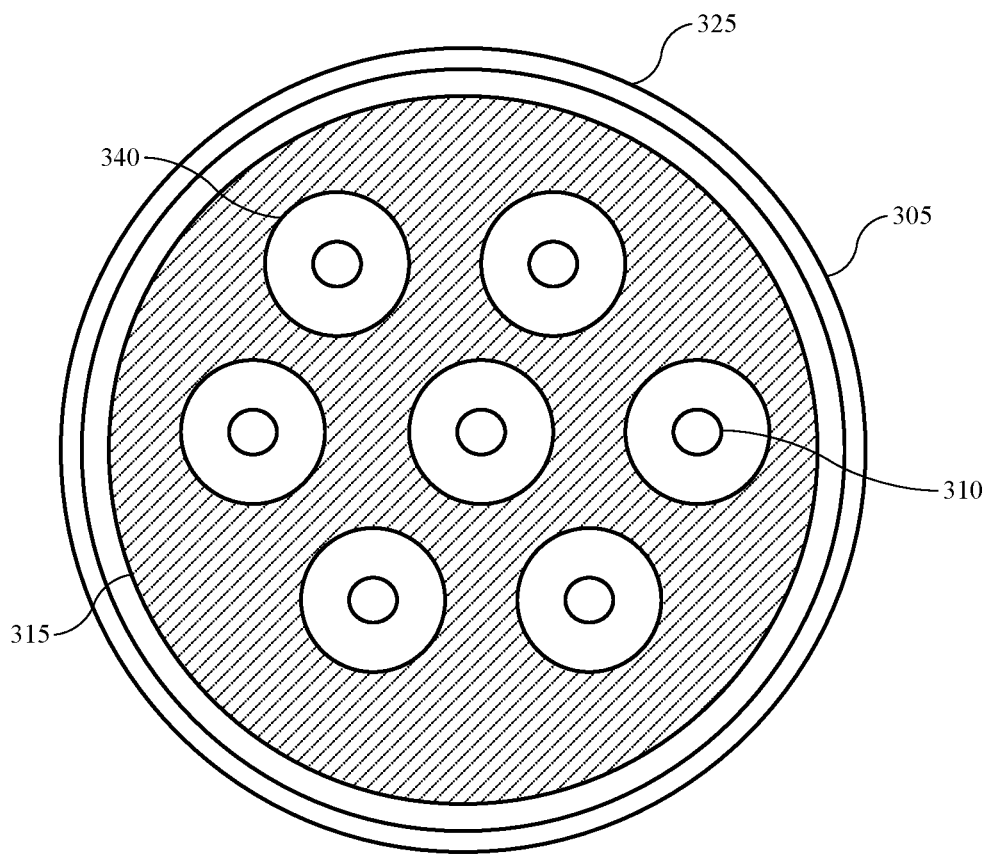
FIG. 3B shows a schematic top view of an exemplary substrate support according to some embodiments of the present technology.

FIG. 3B shows a schematic top view of exemplary substrate support 300 according to some embodiments of the present technology, and may illustrate additional details of the apertures defined by the electrode. Although the electrode 315 may be visible in the figure, it is to be understood that this is only for the purposes of illustration, and in encompassed embodiments the electrode may be fully embedded within the chuck body, and may not be visible within the component. As illustrated, electrostatic chuck body 305 may include a sealing band 325 extending about the substrate support surface, and on which a substrate may be seated as discussed above. The sealing band 325 may define an interior region in which a plurality of protrusions 310 may be defined. It is to be understood that FIG. 3B is shown only to illustrate aspects of the present technology, which may include hundreds or thousands of protrusions across the surface of the substrate support.

Electrode 315 may be a continuous conductive body that extends across the substrate support, and may extend about protrusions 310. The electrode 315 may extend to or beyond an inner radial edge of sealing band 325, although in some embodiments as illustrated, an outer diameter of electrode 315 may be less than an inner diameter of sealing band 325. Similarly, apertures 340, each of which may be formed in line with a corresponding protrusion 310, may be characterized by a diameter greater than a diameter of the corresponding protrusion 310, about which the aperture may extend. By limiting overlap of the electrode with any location at which contact with the substrate may occur, localized chucking force may be reduced at contact points, while a global chucking force across the substrate may be maintained. Accordingly, increased chucking voltages may be applied in some embodiments, while scratching and particle generation may be reduced or limited.

The difference between a diameter of a protrusion and a corresponding aperture through the electrode may be greater than or about 0.10 mm, and may be greater than or about 0.15 mm, greater than or about 0.20 mm, greater than or about 0.25 mm, greater than or about 0.30 mm, greater than or about 0.35 mm, greater than or about 0.40 mm, greater than or about 0.45 mm, greater than or about 0.50 mm, greater than or about 0.55 mm, greater than or about 0.60 mm, greater than or about 0.65 mm, greater than or about 0.70 mm, greater than or about 0.75 mm, greater than or about 0.80 mm, greater than or about 0.85 mm, greater than or about 0.90 mm, greater than or about 0.95 mm, greater than or about 1.00 mm, or more, although as aperture size continues to increase, clamping force may be reduced at contact locations. Consequently, in some embodiments the difference between a diameter of a protrusion and a corresponding aperture through the electrode may be less than or about 1.0 mm, or less. Similarly, depending on the protrusion size, a corresponding aperture may extend a diameter greater than or about 1% more than a diameter of the corresponding protrusion along the substrate support surface, and may extend a diameter greater than or about 1% more, greater than or about 2% more, greater than or about 3% more, greater than or about 4% more, greater than or about 5% more, greater than or about 6% more, greater than or about 7% more, greater than or about 8% more, greater than or about 9% more, greater than or about 10% more, greater than or about 15% more, greater than or about 20% more, greater than or about 25% more, greater than or about 30% more, greater than or about 35% more, greater than or about 40% more, greater than or about 45% more, greater than or about 50% more, or more.

Additionally, a gap between any two protrusions may be characterized by a first length, and a length of the electrode within the gap may be characterized by a second length less than the first. In some embodiments, the second length may be less than or about 99% of the first length, and may be less than or about 95% of the first, less than or about 90% of the first, less than or about 85% of the first, less than or about 80% of the first, less than or about 75% of the first, less than or about 70% of the first, less than or about 65% of the first, less than or about 60% of the first, less than or about 55% of the first, less than or about 50% of the first, or less. This may facilitate lowering a clamping force on edges of the protrusions during operations. To maintain the separation, in vertically separated planes, between the electrode and the protrusions, the electrode may be deposited by physical vapor deposition, screen printing, chemical vapor deposition, or any other process that may allow a pattern to be formed, and which correlates with a pattern of protrusions of the substrate support.

Figure 4:
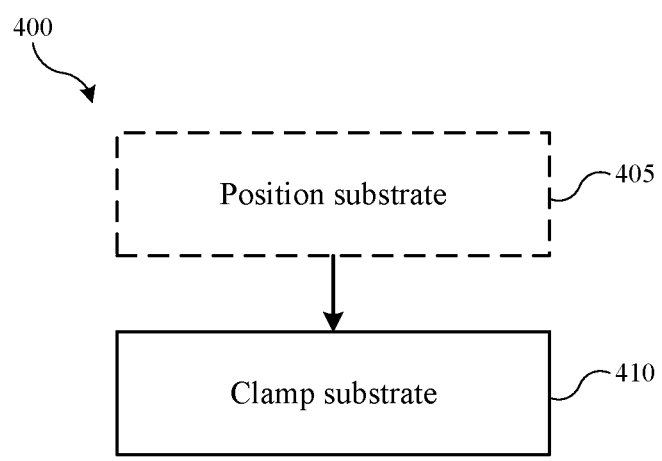
FIG. 4 shows selected operations in a method of semiconductor processing according to some embodiments of the present technology.

The substrate supports explained above may be used during methods according to embodiments of the present technology. FIG. 4 illustrates a method 400 of processing a semiconductor substrate, operations of which may be performed, for example, in one or more chambers 100 incorporated on multi-chamber processing system 10 as previously described. Any other chamber may also be utilized, which may perform one or more operations of any method or process described. Additionally, the method may be performed with chambers or systems including substrate supports that may be, or include any aspect of, substrate support 300 described previously. Method 400 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

During processing operations of method 400, a substrate may be positioned on a substrate support, such as substrate support 300 described above, at optional operation 405. A voltage may be applied to an electrode as previously discussed, which may electrostatically clamp the substrate to the electrostatic chuck body at operation 410, and may clamp the substrate along the protrusions and/or the sealing band as previously described. Depending on the voltage applied, a clamping force at any specific location along the substrate may be greater than or about 50 N, greater than or about 100 N, greater than or about 150 N, greater than or about 200 N, greater than or about 250 N, greater than or about 300 N, greater than or about 350 N, greater than or about 400 N, greater than or about 450 N, greater than or about 500 N, greater than or about 550 N, greater than or about 600 N, greater than or about 650 N, greater than or about 700 N, or higher. As explained previously, by producing apertures in the electrode about each substrate support contact location, a localized chucking force at each protrusion may be less than or about 99% of the global chucking force provided by the electrode, and may be less than or about 98% of the chucking force, less than or about 97% of the chucking force, less than or about 96% of the chucking force, less than or about 95% of the chucking force, less than or about 94% of the chucking force, less than or about 93% of the chucking force, less than or about 92% of the chucking force, less than or about 91% of the chucking force, less than or about 90% of the chucking force, less than or about 85% of the chucking force, less than or about 80% of the chucking force, or less. By utilizing an electrode with specifically located apertures as described, the present technology may limit scratching and particle transfer on the backside of the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly comprising:
an electrostatic chuck body comprising a sealing band extending around an exterior edge of the electrostatic chuck body and defining an interior region, wherein the interior region defines a substrate support surface, wherein the electrostatic chuck body defines a plurality of protrusions extending from the substrate support surface; and
an electrode embedded within the electrostatic chuck body, wherein the electrode defines apertures through the electrode in line with the plurality of protrusions extending from the substrate support surface; and
wherein the electrode comprises a continuous electrode through an entirety of the interior region to an inner radial edge of the sealing band and about the plurality of protrusions.

2. The substrate support assembly of claim 1, wherein the electrode defines an aperture in line with each protrusion of the plurality of protrusions.

3. The substrate support assembly of claim 2, wherein each aperture is characterized by a greater diameter than a diameter of a corresponding protrusion with which the aperture is in line.

4. The substrate support assembly of claim 3, wherein each aperture extends a diameter greater than or about 5% more than a diameter of a corresponding protrusion along the substrate support surface.

5. The substrate support assembly of claim 1, wherein the sealing band extends about an exterior edge of the interior region.

6. The substrate support assembly of claim 5, further comprising:
a gas delivery channel formed through the electrostatic chuck body, wherein the gas delivery channel is configured to deliver a backside gas to volume defined between the plurality of protrusions and the sealing band.

7. The substrate support assembly of claim 6, wherein the gas delivery channel is fluidly coupled with a fluid source, and wherein the fluid source comprises helium gas.

8. The substrate support assembly of claim 1, further comprising:
a power supply coupled with the electrode embedded within the electrostatic chuck body, wherein the power supply is configured to provide a chucking voltage to the electrode.

9. A substrate support assembly comprising:
an electrostatic chuck body, wherein the electrostatic chuck body defines a plurality of protrusions along a substrate support surface of the electrostatic chuck body, and wherein the electrostatic chuck body comprises a sealing band extending around an exterior edge of the electrostatic chuck body and defining an interior region, wherein the interior region defines the substrate support surface; and
an electrode embedded within the electrostatic chuck body, wherein the electrode defines a plurality of apertures through the electrode, wherein each aperture of the plurality of apertures is formed vertically in line with a protrusion of the plurality of protrusions along the substrate support surface; and wherein the electrode comprises a continuous electrode through an entirety of the interior region to an inner radial edge of the sealing band and about the plurality of protrusions.

10. The substrate support assembly of claim 9, wherein each protrusion is characterized by a diameter of greater than or about 1 mm.

11. The substrate support assembly of claim 10, wherein each aperture is characterized by a greater diameter than a diameter of a corresponding protrusion with which the aperture is in line.

12. The substrate support assembly of claim 11, wherein each aperture extends a diameter greater than or about 3% more than a diameter of a corresponding protrusion along the substrate support surface.

13. The substrate support assembly of claim 9, wherein the sealing band extends about an exterior edge of the interior region.

14. The substrate support assembly of claim 13, further comprising:
 a gas delivery channel formed through the electrostatic chuck body, wherein the gas delivery channel is configured to deliver a backside gas to volume defined between the plurality of protrusions and the sealing band, wherein the gas delivery channel is fluidly coupled with a fluid source, and wherein the fluid source comprises helium gas.

15. The substrate support assembly of claim 9, further comprising:
 a power supply coupled with the electrode embedded within the electrostatic chuck body, wherein the power supply is configured to provide a chucking voltage to the electrode.

16. A method of semiconductor processing, the method comprising:
 providing a voltage to an electrode embedded in an electrostatic chuck body, wherein the electrostatic chuck body defines a plurality of protrusions along a substrate support surface of the electrostatic chuck body, wherein the electrostatic chuck body comprises a sealing band extending around an exterior edge of the electrostatic chuck body and defining an interior region, wherein the interior region defines the substrate support surface, and wherein the electrode defines a plurality of apertures through the electrode, wherein each aperture of the plurality of apertures is formed vertically in line with a protrusion of the plurality of protrusions along the substrate support surface, and wherein the electrode comprises a continuous electrode through an entirety of the interior region to an inner radial edge of the sealing band and about the plurality of protrusions; and
 clamping a substrate to the electrostatic chuck body.

17. The method of semiconductor processing of claim 16, wherein the voltage is greater than or about 1000 V.

18. The method of semiconductor processing of claim 16, wherein a chucking force at each protrusion of the plurality of protrusions is less than or about 98% of the chucking force between each protrusion of the plurality of protrusions.

* * * * *